United States Patent
Chatelier et al.

(10) Patent No.: US 7,174,145 B2
(45) Date of Patent: Feb. 6, 2007

(54) METHOD AND APPARATUS FOR AUTOMATIC CHANNEL SEARCH

(75) Inventors: Laurent Chatelier, Geveze (FR); Stéphane Allie, St Armel (FR); Pierre Mauclair, Cesson Sévigné (FR); Nicolas Marce, Bruz (FR); Jean-Luc Jumpertz, Rennes (FR); René Gauthier, Arzon (FR)

(73) Assignee: Thomson Licensing, Boulogne-Billancourt (FR)

(*) Notice: Subject to any disclaimer, the term of this patent is extended or adjusted under 35 U.S.C. 154(b) by 238 days.

(21) Appl. No.: 10/269,657

(22) Filed: Oct. 11, 2002

(65) Prior Publication Data

US 2003/0073459 A1 Apr. 17, 2003

(30) Foreign Application Priority Data

Oct. 15, 2001 (FR) .................................. 01 13411

(51) Int. Cl.
*H04B 1/06* (2006.01)
*H04B 7/00* (2006.01)
*H05B 1/06* (2006.01)

(52) U.S. Cl. .................. 455/277.1; 455/346; 455/66.1
(58) Field of Classification Search ............... 455/3.04, 455/3.01, 3.06, 66.1, 344, 346, 277.1; 348/731; 725/49
See application file for complete search history.

(56) References Cited

U.S. PATENT DOCUMENTS

| | | | | |
|---|---|---|---|---|
| 4,484,356 A * | 11/1984 | Geesen et al. | ........... | 455/165.1 |
| 4,783,848 A | 11/1988 | Ma et al. | ..................... | 455/182 |
| 5,386,587 A * | 1/1995 | Yuzawa | ..................... | 455/3.02 |
| 5,557,617 A * | 9/1996 | Belcher et al. | ............. | 370/316 |
| 6,128,352 A | 10/2000 | Maeda | ........................ | 375/316 |
| 6,130,922 A * | 10/2000 | Stott et al. | ................... | 375/344 |
| 6,282,249 B1 | 8/2001 | Tomesen et al. | ............. | 375/327 |
| 6,424,817 B1* | 7/2002 | Hadden et al. | ............. | 455/3.02 |
| 6,486,925 B1* | 11/2002 | Ko | .............................. | 348/731 |
| 6,510,317 B1* | 1/2003 | Marko et al. | ............... | 455/428 |
| 6,765,628 B1* | 7/2004 | Van Houtum et al. | ...... | 348/732 |
| 6,810,233 B2* | 10/2004 | Patsiokas | ................... | 455/3.02 |
| 2002/0183065 A1* | 12/2002 | Fan | .............................. | 455/452 |
| 2003/0070174 A1* | 4/2003 | Solomon | ..................... | 725/98 |

* cited by examiner

*Primary Examiner*—Tilahun Gesesse
(74) *Attorney, Agent, or Firm*—Joseph J. Lake; Robert D. Shedd; Brian J. Cromarty

(57) ABSTRACT

The invention reduces the time required for automatically searching for channels on a device receiving channels of various widths. The invention proposes a channel detection process which carries out successive passes with frequency spacings corresponding to channels of a specific width. During each pass, only the channels corresponding to the specific width are searched for. The invention also pertains to a multichannel reception device comprising the means required for the operation of the process.

8 Claims, 2 Drawing Sheets

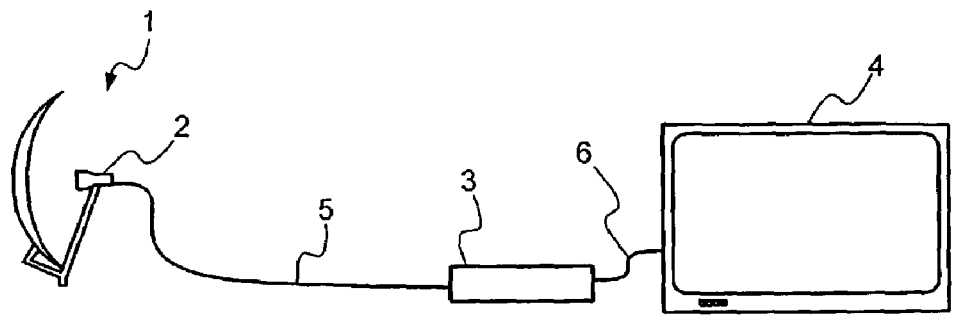
FIG. 1
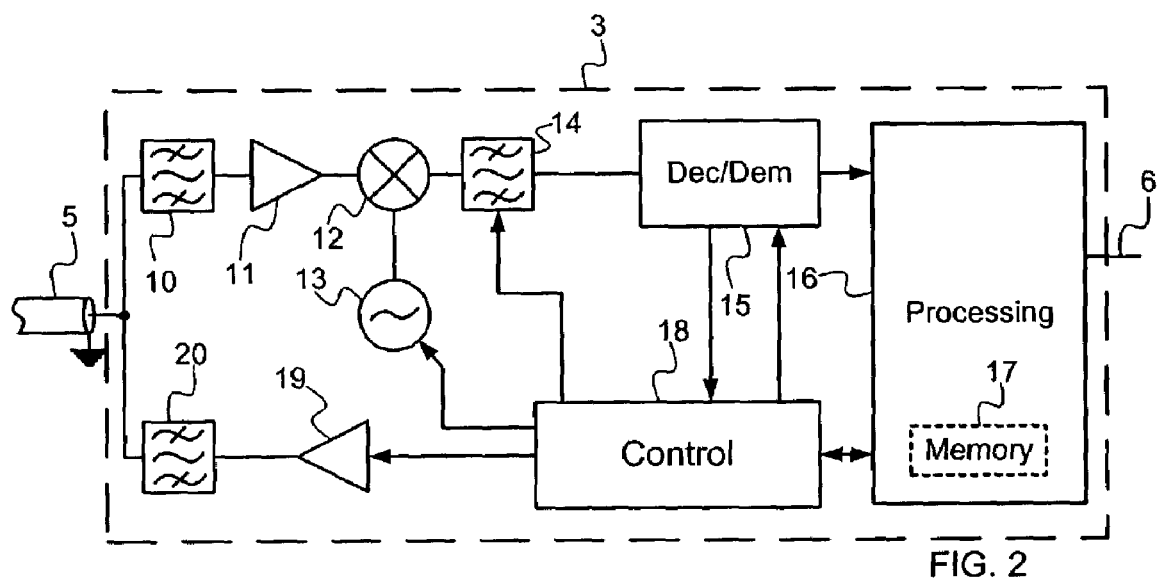
FIG. 2
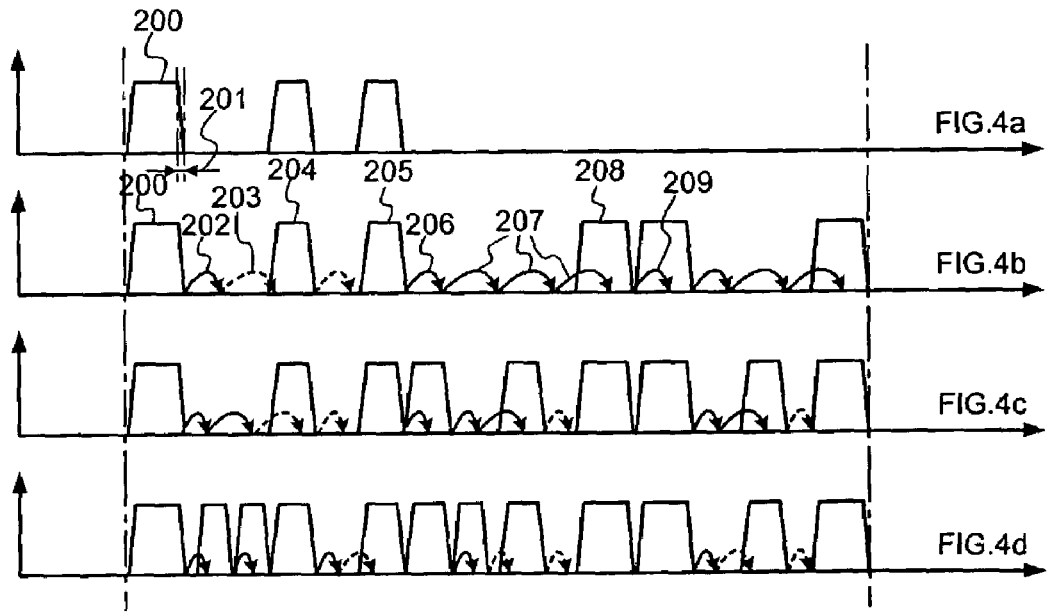
FIG. 4a
FIG. 4b
FIG. 4c
FIG. 4d

METHOD AND APPARATUS FOR AUTOMATIC CHANNEL SEARCH

BACKGROUND OF THE INVENTION

1. Field of the Invention

The invention relates to a process for detecting channels which is used in a reception device carrying out a frequency scan of a transmission band.

2. Description of the Related Art

Television reception devices currently employ automatic channel searching in order to simplify their operational setup. Thus, a user can configure his television or his satellite decoder by pressing just one button.

Automatic searching consists in frequency scanning the entire reception band used by the apparatus and then in storing all the carrier frequencies as well as certain information relating to the channel received. For a satellite decoder, the reception band to be scanned may for example be 1 GHz and makes such scanning relatively lengthy.

To carry out the scanning of the band, it is known to effect a scan based on frequency spacing. The frequency spacing is fixed to be less than the width of a channel so that if a channel is present somewhere in the reception band it will inevitably be come across. During a frequency incrementation, the signal corresponding to the frequency is measured and compared with a threshold. If the signal is greater than the threshold, the frequency is made to vary positively and negatively to determine the carrier frequency of the channel. The channel is then decoded to obtain and to store the information relating to the channel found.

Satellite-based transmissions use various channel widths. By way of example, one and the same satellite can broadcast channels of width 25, 33 or 40 MHz. Scanning is thus performed with a spacing corresponding to the smallest channel width. To mark the channel type, it is necessary to check during each frequency jump which channel has been found with the aid of a successive identification on each channel type.

SUMMARY OF THE INVENTION

An objective of the invention is to reduce the time required for automatically searching for channels on a device receiving channels of various widths.

The invention proposes a channel detection process which carries out successive passes with frequency spacings corresponding to channels of a specific width. During each pass, only the channels corresponding to the specific width are searched for.

The invention is a process for detecting channels in a transmission band using channels which can have at least two bandwidths and in which:

- in the course of a first pass, a frequency scan of the transmission band is carried out using a frequency spacing corresponding to a width of an associated channel,
- in the course of at least one next pass, a frequency scan of the transmission band is carried out using a frequency spacing corresponding to a different width of the channel associated with a previous pass,
- in the course of each pass, only the channels associated with the frequency spacing of the current pass are detected and stored.

The use of successive passes corresponding to a channel width so as to detect only the channels of the said width increases the number of frequency jumps required for the scanning of the frequency band. On the other hand, just one channel detection is carried out for each jump. The invention, although carrying out a larger number of frequency jumps so as to scan the entire band, is faster since the duration required for each jump is smaller.

In order to increase the effectiveness of the process, the scan of the band carried out during a pass is effected in the zones of the band which are not occupied by a previously stored channel.

Preferably, the frequency spacings decrease from one pass to another.

Another improvement consists in that prior to the first pass, a check of presence or absence of previously stored channels is carried out so as to determine the zone or zones actually occupied by the stored channels.

In the case where one and the same channel width is used for several bit rates, a pass is performed for each bit rate.

The invention is also a multichannel reception device using variable-width channels situated in a transmission band, the device comprising:

means for storing channels, means for performing a frequency scan of the transmission band, characterized in that it comprises control means for performing at least two successive passes in the course of which the frequency scan of the transmission band is effected with a frequency spacing corresponding to a bandwidth associated with a sought-after channel type.

BRIEF DESCRIPTION OF THE DRAWINGS

The invention will be better understood, and other features and advantages will become apparent on reading the description which follows, the description making reference to the appended drawings among which:

FIG. 1 represents a satellite-based television transmission reception device,

FIG. 2 represents a satellite decoder according to the invention,

FIG. 4 illustrates the manner of operation of the process of the invention.

DESCRIPTION OF THE PREFERRED EMBODIMENT

Figure 3:
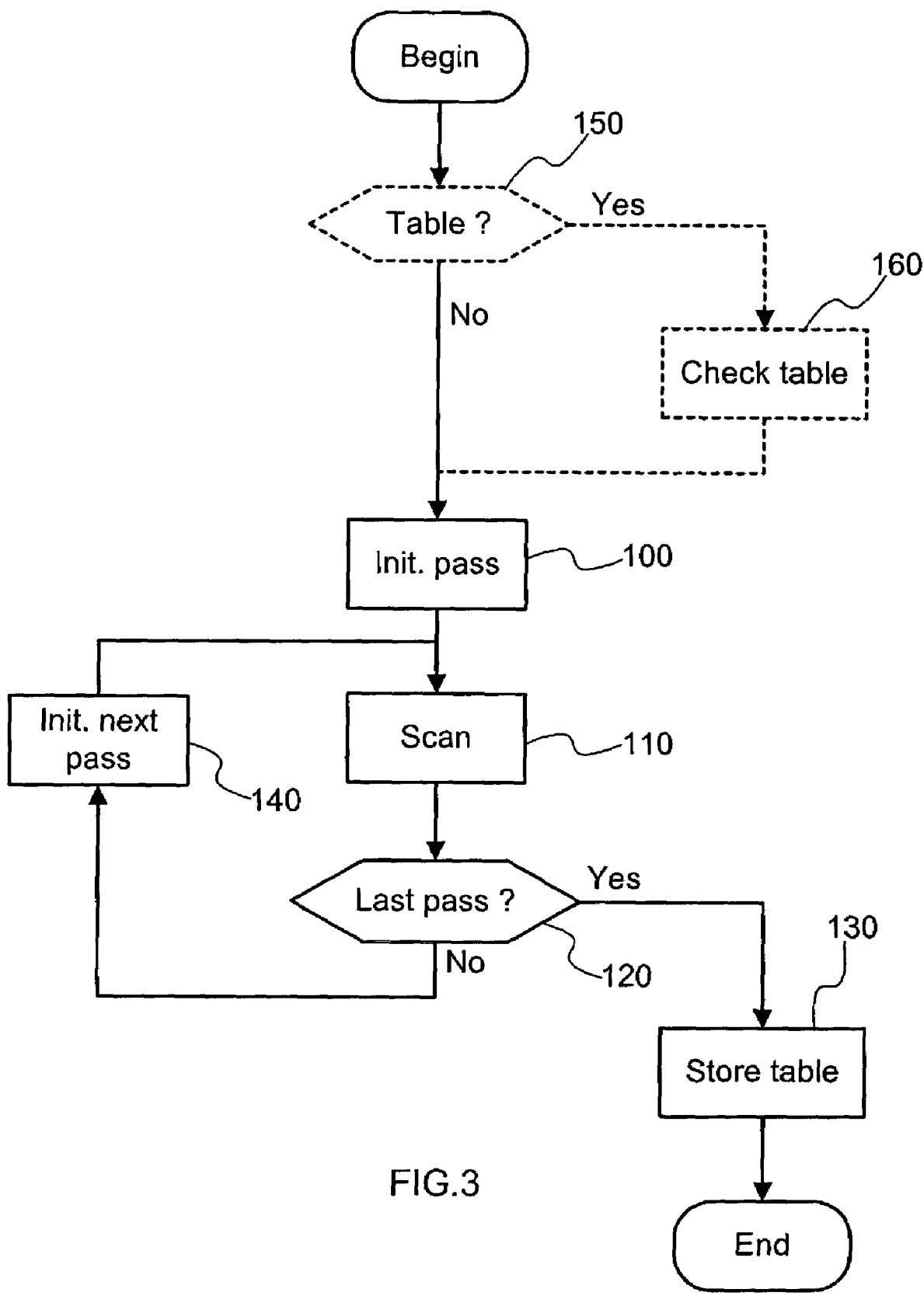
FIG. 3 is an operational flow chart of the channel detection process.

FIG. 1 represents a satellite-based television transmission reception device which comprises an antenna 1 furnished with a low-noise block 2 more commonly referred to as an LNB, a satellite decoder 3 and a television 4. The LNB 2 carries out a transposition of the transmission band used by one or more satellites into an intermediate frequency band lying for example between 950 and 2150 MHz. The satellite decoder 3 receives the signal from the LNB 2 by way of a coaxial cable 5 and supplies a television signal to the television 4 by way of a connection cable 6.

The satellite decoder 3 performs a selection of a channel in the intermediate band then demodulates and decodes the useful information of the channel so as on the one hand to reconstruct a television signal matched to the television 4, and on the other hand to update service data specific to the satellite-based programme distribution operator.

A modelling of the satellite decoder 3 is represented in FIG. 2. The modelling of FIG. 2 shows more especially the various elements implemented according to the invention.

A first bandpass filter 10 is connected to the coaxial cable 5 so as to select the intermediate band for example lying between 950 and 2150 MHz. An amplifier 11 is connected to the first bandpass filter 10 so as to amplify the intermediate-band signal. A mixer 12 transposes the intermediate band with the aid of a signal produced by a frequency synthesizer 13. A second bandpass filter 14 selects a channel in the band transposed by the mixer 12. The second filter 14 is centred on a modulation frequency and can have a variable bandwidth so as to select a bandwidth corresponding to a given channel.

A demodulation and decoding circuit 15 performs the demodulation and the decoding of the channel and supplies a data train. A processing circuit 16 carries out the processing of the data and reconstructs a video signal which is supplied on the cable 6. The processing circuit 16 oversees the entire decoder and comprises a memory 17 for storing, among other things, the frequency plan of the satellite band. A control circuit 18 serves to oversee the channel received by sending a frequency preset to the synthesizer 13, a bandwidth selection preset to the second filter 14, a channel width and bit rate preset to the demodulation and decoding circuit 15 and control signals to the LNB 2 by way of an amplifier 19, of a filter 20 and of the coaxial cable 5. The control circuit 18 additionally has an input for receiving a lockon signal of the demodulation and decoding circuit 15 and an input/output for exchanging instructions and information with the processing circuit 16.

When an operator selects a channel stored in the memory 17, the processing circuit 16 supplies the control circuit 18 with the change channel request together with the parameters (for example carrier frequency, channel width, polarization of the LNB) read from the memory 17.

When an operator instigates an automatic channel search, the processing circuit 16 triggers a search algorithm in the control circuit 18. The control circuit 18 then has read and write access to the memory 17.

The general channel search algorithm is described in FIG. 3. A step 100 serves to initialize the first pass. In the course of step 100, the control circuit sends the necessary instructions regarding frequency, bandwidth and bit rate to the frequency synthesizer 13, to the second filter 14 and to the demodulation and decoding circuit 15 which correspond for example to the first pass. By way of example, the channel width is fixed at 40 MHz, the bit rate at 40 Mbits/s. In the course of step 100, the control circuit determines a frequency spacing to be used for the first pass.

After step 100 is performed a step 110 of scanning the useful band for a pass. Step 110 consists in testing for the presence of one or more channels in the intermediate frequency band which corresponds to the fixed width and which uses the fixed bit rate. To reliably detect the presence of a channel, it is sufficient to scan the intermediate frequency band with the aid of a frequency spacing specific to the width of the sought-after channel. The frequency spacing associated with the sought-after channel must be less than the width of the channel plus the minimum space separating two channels. For each frequency spacing we await a duration corresponding to the maximum lockon time of the demodulation and decoding circuit 15. If in the course of this duration a channel corresponding to the sought-after channel type is found, the demodulation and decoding circuit 15 indicates same to the control circuit 18 which stores the channel and the corresponding information and then we go to the next channel.

If the transmission type used exhibits uncertainty as regards the positioning of the spectrum of the channel, the operation is carried out for each frequency spacing on the signal leaving the second filter 14 and on the signal leaving with a spectrum which is the inverse of itself. If two perpendicular polarizations are used for transmission, scanning is performed a first time on a first polarization and a second time on a second polarization.

On completion of step 110, a test 120 checks whether all the passes have been carried out, a pass corresponding to the search for a channel type. If all the passes have been carried out, then we store definitively, during a step 130, the frequency plan table corresponding to the channels found in the course of all the passes in the memory 17 and the channel search comes to an end. If all the passes have not been carried out, then a step 140 of initializing the next pass is performed. Step 140 is identical to step 100 but uses parameters corresponding to a channel type which has not been sought. On completion of step 140, the scanning step 110 is carried out again.

By way of comparative example between the invention and the state of the art, it is assumed that three channel types are sought having channel widths respectively equal to 25, 33 and 40 MHz in a device where two polarizations are used with uncertainty regarding the positioning of the spectrum.

According to the state of the art, the search time Tret is equal to: Tret=2* n*(Tf+3*(Td+2*Ta), with n the number of frequency jumps performed when scanning the intermediate band, Tf the positioning time for the frequency synthesizer 13, Td the positioning time for the parameters of the demodulation and decoding circuit 15, Ta the maximum lockon time of the demodulation and decoding circuit including a spectrum inversion and the factors "2" are due on the one hand to the double scan for each polarization and on the other hand to the tests on the spectrum received and the inverted spectrum.

According to the invention, the search time Tinv is equal to: Tinv=4*n1*Tfd*Ta+4*n2*Tfd*Ta+4*n3*Tfd*Ta, with n1, n2 and n3 the number of frequency jumps carried out in scanning the band for respectively each channel type, Tfd the time required for the simultaneous positioning of the frequency synthesizer 13 and of the parameters of the demodulation and decoding circuit 15, the coefficient four being due to the double polarization and to the inversion of the spectrum.

In order to be compared, these two formulae must refer to effective durations taken for circuits of like performance. By way of numerical example, we have Tf=7 ms, Td=6 ms, Tfd=7 ms, Ta=115 ms. Additionally, the intermediate bandwidth being equal to 1200 MHz, the frequency spacing corresponding to the narrowest channel is used for the calculation of n which corresponds for example to the width of the channel, in the example 25 MHz, this giving n=1200/25=48. For n1, n2 and n3 we take for example the widths of sought-after channels corresponding to the pass for which the frequency spacing is used, i.e. respectively 25, 33 and 40 MHz, this giving: n1=1200/25=48, n2=1200/33=36, n3=1200/40=30. With such numerical data, we obtain: Tret=68.64 s and Tinv=55.632 s. In this case the gain is around 20%. If the frequency spacing associated with the channels is more restricted, the gain may be greater.

The invention can be considerably improved in terms of effectiveness when an intermediate frequency band scan limited to the zones which are not occupied by a previously found channel is performed during each pass. By way of example, if the band contains four 40 MHz channels, five 33 MHz channels and three 25 MHz channels and if the scan is performed in an order of decreasing size of the channels, then the search is limited to a band of 1200−4*40=1040

MHz for the search for the 33 MHz channels and to a band of 1040−5*33=875 MHz for the search for the 25 MHz channels. We then obtain coefficients n1=875/25=35, n2=1040/33=31 and n3=30. The search time then becomes equal to Tinv=46.848 s i.e. a gain of 30% which, moreover increases with increasing spectral occupancy.

The choice of decreasing order of size of the channels is favoured since for a number of equal channels for each channel type, this is what makes it possible to reduce to the maximum the number of passes by using smaller frequency spacings over more restricted bandwidths. On the other hand, if the transmission system is to operate with a more widely used channel type, it may be beneficial to use a different search order for example decreasing calculated on the product of the probability of presence of a channel type times the width of the channel.

Another improvement consists in using a prior table. For this purpose, a test 150 checks whether a frequency table is already recorded. A frequency table can be supplied upon manufacture of a satellite decoder, or be present in a pay-channel subscriber card, or else result from a search performed previously. If a frequency table is found, a step 160 of checking the table is performed. The step 150 consists simply in positioning the reception device on each channel stored and then in checking that the expected channel is indeed present. On completion of step 150, step 100 described previously is carried out. If on the other hand no table is stored, step 100 is carried out immediately after test 150.

The checking of the table takes only the time to position the channels stored under predefined conditions, this being much shorter than a scan of the entire intermediate frequency band. On the other hand, the checked presence of the channels enables the intermediate frequency band to be scanned right from the first pass in a manner restricted to the unoccupied zones.

FIGS. 4a to 4d illustrate the running of the complete algorithm limited to a search in the unoccupied zones. Other variants and advantages will be explained with the aid of these figures. For reasons of representation, the intermediate frequency band is represented restricted in size. Moreover, the drawings may exhibit distortions as far as the dimensions are concerned and should not be regarded as representative of an exact scale.

FIG. 4a shows the frequency plan corresponding to what is recorded in the memory 17 after the check of step 160. Three stored channels are effectively present in the intermediate frequency band leaving three disjoint zones on the intermediate frequency band. The actual width of a channel represented 200 corresponds to the horizontal part, the flanks of the channel correspond to the channel transition zone required for good rejection of the neighbouring frequencies.

FIG. 4b illustrates the first pass carried out to search for the channels of width 40 MHz. In order to reduce the lockon time during the effective detection of a channel, the frequency spacing is determined so as to increment the frequency of the synthesizer 13 in such a way as to preferably fall in the middle of a channel and postulating that the channels are sited in such a way as to maximize the number of channels in the intermediate frequency band. For this purpose, the frequency spacing can take two values. A first value of spacing corresponds to half the width of the channel plus half the minimum gap between two channels, this corresponding for example to boosting the width of the channel by 15% and to dividing the result by two. This first value serves to increment the frequency of the synthesizer 13 on the basis of the border frequency of the portion of band to be scanned. A second value corresponds to the channel width plus the minimum distance between two channels i.e. the channel width boosted by 15%.

A first frequency jump 202 by the first value is performed on the basis of the transition zone limit for the channel 200. No channel having been found following the first jump 202, the frequency ought to be increased by the second value through a jump 203. Now, the distance between the frequency obtained during the jump 202 and a channel 204 found previously does not make it possible to site a channel of width 40 MHz, hence the jump is not performed. In the next free zone the available bandwidth also does not make it possible to site a 40 MHz channel, hence no jump is carried out. The third zone sited after the channel 205 being sufficiently wide to contain at least one channel, a jump 206 by the first value is performed from the transition zone limit for the channel 205 followed by a succession of jumps 207 until the channel 208 is obtained. After the channel 208, we start again with a jump 209 by the first value from the transition zone limit for the channel 208. The operation is continued in this way until the end of the intermediate frequency band.

FIG. 4c illustrates a second pass for searching for channels of width 33 MHz on the same principle as the first pass by using proportionally smaller frequency jumps. FIG. 4d corresponds to the third pass effected for detecting channels of width 25 MHz.

In FIGS. 4b to 4d the jumps shown dashed are not performed since it is not possible to find a channel of the sought-after type. The unscanned frequency spans have to be deduced from the total band to be scanned, this having the effect of further reducing the channel search time.

The person skilled in the art may note in these figures that an automatic search for updating the channels is effected very rapidly when the band stored at the end of an earlier search leaves few available frequencies.

Other variant embodiments are possible. The choice of the frequency spacings to be used may also be different from the values indicated.

Likewise, the number of channel types to be searched for may vary in different proportions. Through channel types, it is also possible to take account of channels of like bandwidth whose bit rate is different. Specifically, the detection operation comprises the locking on of the demodulator and the identifying of the bit rate of the channel with respect to a desired reference. In certain cases the bit rate of the channel is strongly related to the type of modulation and the locking on of the carrier frequency must be redone when the bit rate of the channel changes independently of the bandwidth.

What is claimed is:

1. A method for detecting channels in a transmission band using channels which have at least two bandwidths comprising the steps of:

scanning the transmission band using first frequency spacings corresponding to first channel width to detect the presence of channels at the first frequency spacings, storing information associated with each detected channel at the first frequency spacings in a memory, scanning the transmission band using second frequency spacings corresponding to a second channel width to detect the presence of channels at the first frequency spacings, and storing information associated with each detected channel.

2. The method according to claim 1, wherein the first frequency spacing is less than the second frequency spacing.

3. The method according to claim 1, wherein prior scanning the frequency band, a check of presence of previously stored channels is carried out so as to determine the zones actually occupied by the stored channels.

4. The method according to claim 1, wherein each of the plurality of scars of the transmission bands includes only frequencies which are not occupied by a previously detected channel.

5. The method according to one of claim 1, further comprising the step of storing all the channels so as to be able to be reused subsequently.

6. The method according to claim 1, wherein each of the plurality of scans of the transmission band are effected according to a first and a second polarization, the first and the second polarization being perpendicular.

7. The method according to claim 1, wherein the same frequency span is used for several bit rates, characterized in that a scan of the transmission band pass is performed for each bit rate.

8. A multichannel reception device using variable-width channels situated in a transmission band, the device comprising:
   means for storing channels,
   means for performing a frequency scan of the transmission band, and
   control means for performing at least two successive passes in the course of which the frequency scan of the transmission band is effected with a frequency spacing corresponding to a bandwidth associated with a sought-after channel type.

* * * * *